US010672948B2

(12) United States Patent
Choi et al.

(10) Patent No.: US 10,672,948 B2
(45) Date of Patent: Jun. 2, 2020

(54) METHODS FOR PRODUCING LIGHT EXTRACTION STRUCTURES FOR SEMICONDUCTOR DEVICES

(71) Applicant: Saphlux, Inc., Branford, CT (US)

(72) Inventors: Joo Won Choi, Woodbridge, CT (US); Chen Chen, New Haven, CT (US)

(73) Assignee: Saphlux, Inc., Branford, CT (US)

( * ) Notice: Subject to any disclaimer, the term of this patent is extended or adjusted under 35 U.S.C. 154(b) by 0 days.

(21) Appl. No.: 15/843,758

(22) Filed: Dec. 15, 2017

(65) Prior Publication Data

US 2019/0189843 A1   Jun. 20, 2019

(51) Int. Cl.
*H01L 33/00* (2010.01)
*H01L 33/10* (2010.01)
*H01L 33/06* (2010.01)
*H01L 33/32* (2010.01)

(52) U.S. Cl.
CPC ............ *H01L 33/10* (2013.01); *H01L 33/007* (2013.01); *H01L 33/0075* (2013.01); *H01L 33/06* (2013.01); *H01L 33/32* (2013.01)

(58) Field of Classification Search
CPC ... H01L 33/10; H01L 33/007; H01L 33/0075; H01L 33/06; H01L 33/32
See application file for complete search history.

(56) References Cited

U.S. PATENT DOCUMENTS

| | | | | |
|---|---|---|---|---|
| 6,304,362 | B1 * | 10/2001 | Zheludev | G02F 1/30 359/241 |
| 6,492,190 | B2 * | 12/2002 | Yamanaka | C30B 13/00 257/E21.115 |
| 7,196,347 | B2 * | 3/2007 | Ishikawa | |
| 7,638,414 | B2 * | 12/2009 | Choi | H01L 21/02378 257/103 |
| 7,977,703 | B2 * | 7/2011 | Shakuda | H01L 21/02403 257/103 |
| 8,212,268 | B2 * | 7/2012 | Konno | H01L 33/10 257/95 |

(Continued)

OTHER PUBLICATIONS

Muth et al., "Absorption Coefficient and Refractive Index of GaN, AlN and AlGaN Alloys", 1999, MRS Internet J. Nitride Semicond. Res. 4S1, G5.2 (Dec. 1999).*

(Continued)

*Primary Examiner* — Nikolay K Yushin

(57) ABSTRACT

Aspects of the disclosure provide for mechanisms for fabricating light extraction structures for semiconductor devices (e.g., light-emitting devices). In accordance with some embodiments, a semiconductor device is provided. The semiconductor device may include: a first semiconductor layer including an epitaxial layer of a semiconductor material; a second semiconductor layer comprising an active layer; and a light-reflection layer configured to cause at least a portion of light produced by the active layer to emerge from the semiconductor device via a surface of the second semiconductor layer, wherein the light-reflection layer is positioned between the first semiconductor layer and the second semiconductor layer. In some embodiments, the semiconductor material includes gallium nitride. In some embodiments, the light-reflection layer includes a layer of gallium.

11 Claims, 3 Drawing Sheets

(56) References Cited

U.S. PATENT DOCUMENTS

| | | | |
|---|---|---|---|
| 8,946,753 B2* | 2/2015 | Zhu | H01L 33/06 257/100 |
| 9,153,944 B2* | 10/2015 | Lee | H01S 5/423 |
| 9,514,926 B2 | 12/2016 | Hong et al. | |
| 2002/0006681 A1* | 1/2002 | Yamanaka | C30B 13/00 438/29 |
| 2004/0140474 A1* | 7/2004 | Ueda | H01L 27/18 257/79 |
| 2005/0029528 A1* | 2/2005 | Ishikawa | |
| 2006/0065901 A1* | 3/2006 | Aoyagi | H01L 33/0079 257/79 |
| 2008/0217647 A1* | 9/2008 | Choi | H01L 21/02378 257/103 |
| 2009/0283782 A1* | 11/2009 | Shakuda | H01L 21/02403 257/94 |
| 2011/0057214 A1* | 3/2011 | Konno | H01L 33/10 257/95 |
| 2012/0261686 A1* | 10/2012 | Lu | H01L 33/007 257/91 |
| 2015/0222094 A1* | 8/2015 | Lee | H01S 5/423 372/38.05 |

OTHER PUBLICATIONS

Lenham, "The Optical Constants of Gallium", 1963, Proc. Phys. Soc. 82 933 (Dec. 1963).*

* cited by examiner

METHODS FOR PRODUCING LIGHT EXTRACTION STRUCTURES FOR SEMICONDUCTOR DEVICES

CROSS-REFERENCE TO RELATED APPLICATIONS

The present application is related to U.S. patent application Ser. No. 15/844,344 entitled "Air Void Structures for Semiconductor Fabrication", filed on the same day as the present application, which is assigned to the assignee of the present application and is hereby incorporated by reference in its entirety.

TECHNICAL FIELD

The implementations of the disclosure generally relate to semiconductor devices and, more specifically, to light extraction structures for semiconductor devices (e.g., light-emitting devices).

BACKGROUND

Semiconductor materials, such as Group III-V materials (e.g., AN, GaN, and InN) are suitable for producing light-emitting devices. For example, gallium nitride (GaN) and other III-nitride materials have relatively wide band gaps and can be used to make electro-optic devices (e.g., light-emitting diodes (LEDs), laser diodes (LDs), etc.) that emit radiation in the green and blue regions of the visible spectrum. Group III nitride materials can also be used to fabricate high-power electronics because they exhibit higher breakdown voltages when used for fabricating integrated transistors.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Aspects of the disclosure provide for mechanisms for fabricating light extraction structures for semiconductor devices (e.g., light-emitting devices). In accordance with some embodiments, a semiconductor device is provided. The semiconductor device may include: a first semiconductor layer including a first epitaxial layer of a semiconductor material; a second semiconductor layer including an active layer; and a light-reflection layer configured to cause at least a portion of light produced by the active layer to emerge from the semiconductor device via a surface of the second semiconductor layer, wherein the light-reflection layer is positioned between the first semiconductor layer and the second semiconductor layer. In some embodiments, the semiconductor material may include gallium nitride. In some embodiments, the light-reflection layer may include a layer of gallium.

In some embodiments, the semiconductor material has a first refractive index. The light-reflection layer may include a reflective material having a second refractive index. The second refractive index may be different from the first refractive index.

In some embodiments, the reflective material may include gallium.

In some embodiments, the semiconductor material may include a group III-V material. In some embodiments, the group III-V material may include gallium.

In some embodiments, the second semiconductor layer may further include a second epitaxial layer of the semiconductor material doped with a first conductivity.

In some embodiments, the second semiconductor layer may further include a third epitaxial layer of the semiconductor material doped with a second conductivity.

In some embodiments, the active layer may include a multi-quantum well structure.

In accordance with some embodiments, a method for fabricating a semiconductor device is provided. The method may include: forming, on a first semiconductor layer, a light-reflection layer configured to cause at least a portion of light produced by a second semiconductor layer to emerge from the semiconductor device via a surface of the second semiconductor layer; and forming the second semiconductor layer on the light-reflection layer.

In some embodiments, forming the light-reflection layer may further include: forming an intermediate layer including a first group III material and a second group III material; and removing at least a portion of the second group III material from the intermediate layer.

In some embodiments, the first group III material may include gallium. In some embodiments, the second group III material may include indium.

In some embodiments, forming the intermediate layer may include adjusting a temperature in a processing chamber to a first temperature. In some embodiments, removing at least the portion of the second group III material may include adjusting the temperature in the processing chamber to a second temperature.

In some embodiments, the second temperature is higher than the first temperature.

In some embodiments, the first temperature is between 300° C. and 800° C.

In some embodiments, the second temperature is higher than 800° C.

In some embodiments, forming the intermediate layer may further include: flowing a first precursor comprising the first group III material in the processing chamber; and flowing a second precursor comprising the second group III material in the processing chamber.

In some embodiments, removing at least the portion of the second group III material from the intermediate layer may include flowing a gas flow including hydrogen in the processing chamber.

In some embodiments, removing at least the portion of the second group III material from the first semiconductor layer may include: stopping flowing the second precursor in the processing chamber.

In some embodiments, the method may further include forming the first semiconductor layer using at least one of a metal organic chemical vapor deposition (MOCVD) process or a molecular beam epitaxy (MBE) process.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
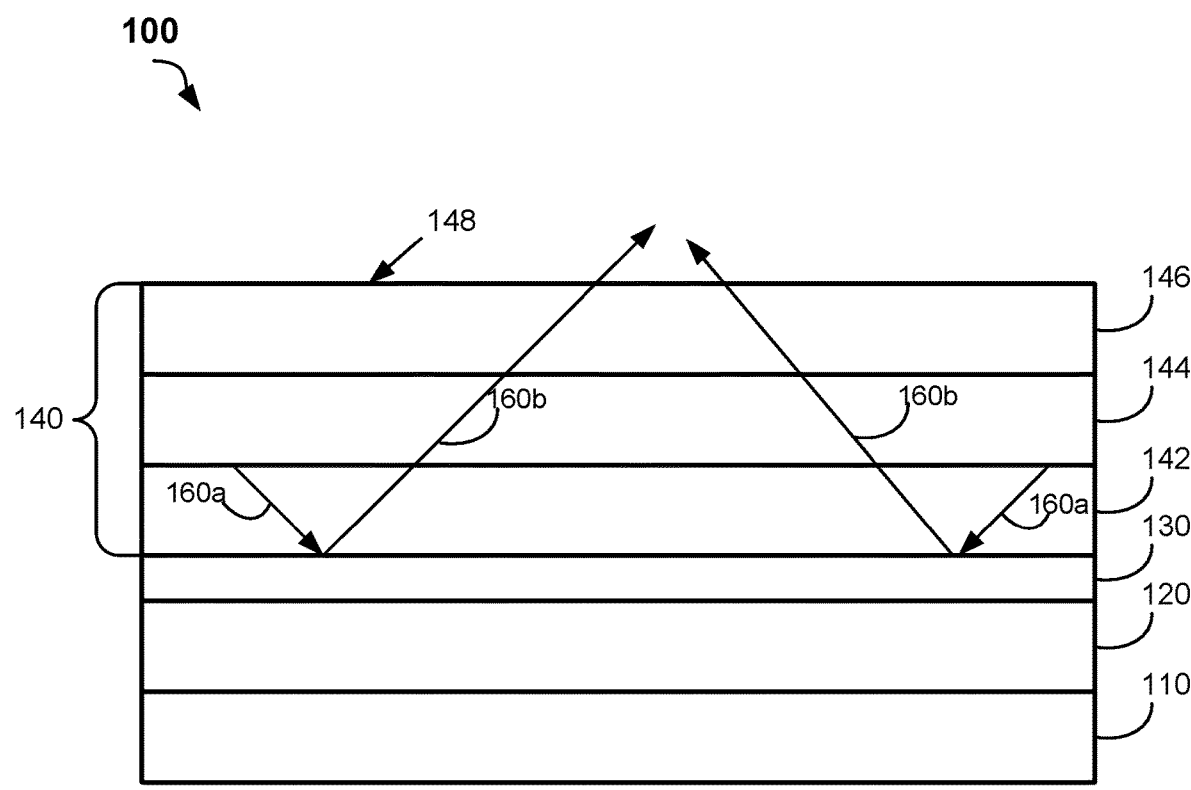
FIGS. 1A and 1B are schematic diagrams illustrating structures associated with a process for fabricating an example semiconductor device in accordance with some embodiments of the disclosure.

Aspects of the disclosure provide for mechanisms for forming light extraction structures for semiconductor devices (e.g., light-emitting devices). Light-emitting devices comprising semiconductor materials (e.g., GaN-based light-emitting diodes) have been used in a variety of applications (e.g., lighting, traffic signals, liquid-crystal displays, etc.). However, the semiconductor materials typically have a relatively high refractive index compared to air or encapsulating epoxy. As a result, light produced by a conventional light-emitting device may experience total internal reflection if it reaches an exposed surface of the light-emitting device beyond a critical angle. As such, a significant amount of light produced by such conventional light-emitting device may be reflected back into the light-emitting device and may be absorbed and turned into additional heat in the light-emitting device. This may deteriorate the efficiency of the light-emitting device. Conventional approaches to enhancing light extraction for light-emitting devices typically involve complex etching processes (e.g., Fast Atom Beam (FAB) etching) that are cost-inefficient and time-consuming. Furthermore, the conventional approaches utilize ex-situ processes to enhance light extraction for light-emitting devices and may thus suffer from growth interruption.

Aspects of the disclosure address the above deficiencies and other deficiencies of the conventional approaches by providing mechanisms for fabricating light extraction structures in a light-emitting device during the growth of epitaxial layers of the light-emitting device. The light extraction structures may include a light-reflection layer positioned between an epitaxial layer of a semiconductor material (e.g., GaN) and an active layer including one or more single quantum-well structures and/or multiple quantum-well structures. The light-reflection layer may include a layer of a reflective material, such as gallium. The light-reflection layer can cause one or more portions of light produced by the active layer to emerge from the light-emitting device to its surroundings (e.g., air).

In one implementation, a group III-V material, such as gallium nitride (GaN), may be grown on a substrate (e.g., a sapphire substrate) utilizing a metal organic chemical vapor deposition (MOCVD) process, a molecular beam epitaxy (MBE) process, or any other suitable process for epitaxial growth of III-V materials. The substrate may be cleaned (e.g., heated in a hydrogen ambient or any other suitable ambient) in a processing chamber (e.g., a MOCVD reactor). The temperature in the processing chamber may be adjusted to a first value (e.g., a temperature over 1000° C.) to facilitate the growth of the group III-V material. In some embodiments, precursors containing a group III material (e.g., gallium) and nitrogen may then be provided to the processing chamber to grow a group III-nitride material. The precursors may react at the surface of the heated substrate to form a group III-nitride layer (e.g., a gallium nitride layer) on the substrate.

During the growth of the group III-V material, the mechanisms may form a light-reflection layer that can cause at least a portion of light produced by the light-emitting device to emerge from the light-emitting device. For example, the mechanisms can control the temperature of the processing chamber to a second value (e.g., a temperature between 300° C. and 800° C.). The mechanisms can also flow precursors containing gallium and indium in the processing chamber to form a layer containing gallium and indium (e.g., an indium gallium nitride (InGaN) layer). The precursors may contain a desirable indium composition (e.g., a composition greater than 5%, a composition greater than 35%, etc.). Indium droplets may form on a surface of the InGaN layer in some embodiments. The mechanisms can adjust the temperature in the processing chamber to a third value and can flow hydrogen in the processing chamber. Additionally, the mechanisms can stop flowing the precursor(s) containing indium in the processing chamber. The third value may be and/or include, for example, a temperature that is higher than 800° C. The presence of hydrogen in the processing chamber may retard incorporation of indium into the InGaN layer and may result in no or low incorporation of indium into the InGaN layer. The presence of hydrogen may also remove the indium droplets from the surface of the InGaN layer. The removal of the indium from the InGaN layer may form a light-reflection layer including gallium. More particularly, for example, the removal of the indium may form voids in the InGaN layer and may cause the deposited gallium to collapse to form a layer of gallium.

After the formation of the light-reflection layer, the mechanisms can form one or more epitaxial layers of the III-V material and/or any other suitable material, such as an n-doped layer of the III-V material, an active layer, a p-doped layer of the III-V material, etc. In some embodiments, to form the epitaxial layers of the III-V materials, the mechanisms can adjust the temperature in the processing chamber to a fourth value to facilitate the formation of the epitaxial layers. The fourth value may be a temperature that is higher than 900° C. in some embodiments.

Accordingly, the mechanisms provided in the present disclosure can enable the formation of light extraction structures at any desired position in epitaxial layers of semiconductor materials (e.g., III-V materials) during uninterrupted epitaxial growth of the semiconductor materials.

As referred to herein, a group III material may be any material that includes an element in the boron group, such as gallium (Ga), indium (In), thallium (Tl), aluminum (Al), and boron (B). A group V material may be any material that includes an element in the nitrogen group, such as nitrogen (N), phosphorus (P), arsenic (As), etc. A group III-V material may be any material that includes a group III element and a group V element, such as aluminum nitride (AlN), gallium nitride (GaN), and indium nitride (InN). As referred to herein, a light-emitting device may be any device that is capable of producing light.

Examples of embodiments of the present disclosure will be described in more detail with reference to the accompanying drawings. It should be understood that the following embodiments are given by way of illustration only to provide thorough understanding of the disclosure to those skilled in the art. Therefore, the present disclosure is not limited to the following embodiments and may be embodied in different ways. Further, it should be noted that the drawings are not to precise scale and some of the dimensions, such as width, length, thickness, and the like, can be exaggerated for clarity of description in the drawings. Like components are denoted by like reference numerals throughout the specification.

Figure 1B:
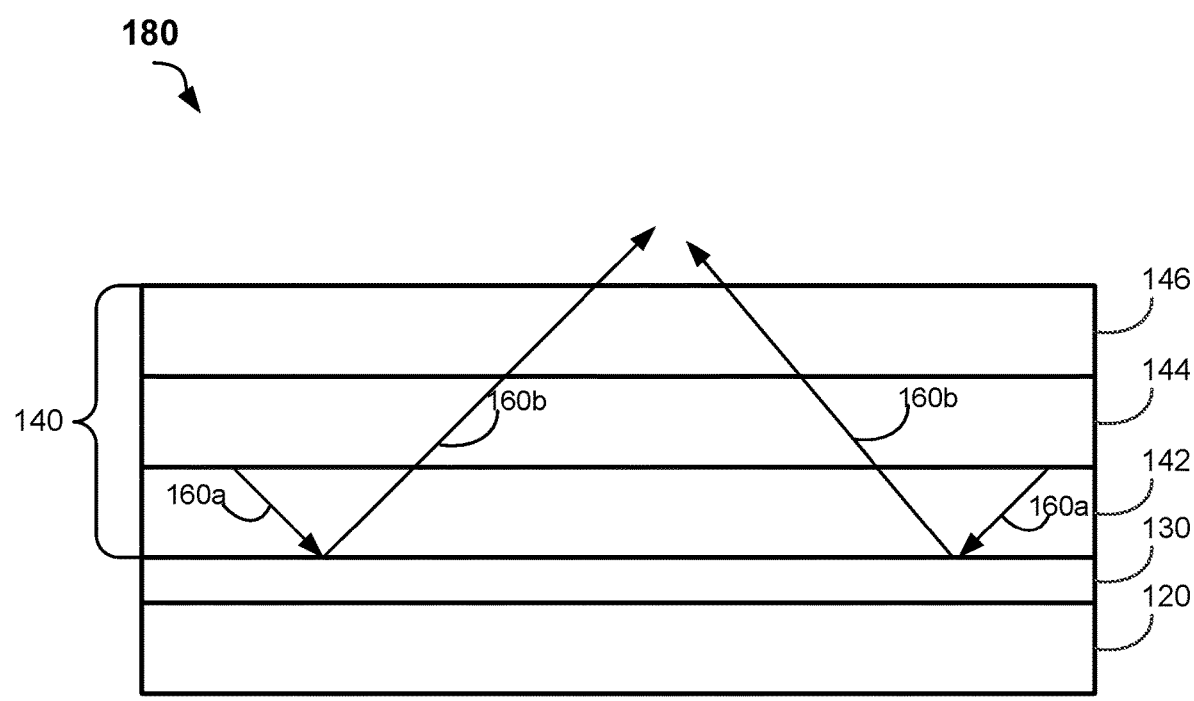

FIGS. 1A and 1B are schematic diagrams illustrating structures associated with a process for fabricating an example semiconductor device 100 in accordance with some embodiments of the present disclosure. The semiconductor device 100 may be and/or include a light-emitting device.

As illustrated in FIG. 1A, semiconductor device 100 may include a substrate, 110, a first semiconductor layer 120, a light-reflection layer 130, and a second semiconductor layer 140. The substrate 110 may contain any material suitable for serving as a substrate for crystalline growth, such as sapphire, gallium nitride (GaN), silicon carbide (SiC), silicon (Si), quartz, Gallium Arsenide (GaAs), Aluminum nitride (AlN), etc. The substrate may contain one or more crystalline materials having any suitable crystallographic orientation (e.g., a nonpolar orientation, a semipolar orientation, or a polar orientation).

In some embodiments, the substrate 110 can include one or more layers (not shown in FIG. 1A). For example, the substrate 110 can include a first layer comprising a heterogeneous substrate for growth of a semiconductor material (e.g., a sapphire substrate, a silicon substrate, etc. for growth of a group III-V material). As another example, substrate 110 can include a second layer comprising a semiconductor material, such as a group III-V material (e.g., gallium nitride (GaN)). The second layer may contain one or more crystalline materials having any suitable crystallographic orientation, such as a nonpolar orientation, a semipolar orientation, etc.

As illustrated in FIG. 1A, the first semiconductor layer 120 may be formed on substrate 110. The first semiconductor layer 120 may include an undoped layer of a semiconductor material (e.g., a group III-V material) that is not doped with impurities. The first semiconductor layer 120 may or may not include a doped layer of the semiconductor material doped with a particular conductivity. In some embodiments, the first semiconductor layer 120 does not include a doped layer of the semiconductor material.

The first semiconductor layer 120 may include one or more layers of one or more semiconductor materials and/or any other suitable material. Each of the layers may be formed using any suitable processes for growing crystalline layers, such as metal organic chemical vapor deposition (MOCVD) (also referred to as metalorganic vapor phase epitaxy (MOVPE)), molecular-beam epitaxy (MBE), vapor phase epitaxy (VPE), and/or any other suitable epitaxial growth process. In some embodiments, the first semiconductor layer 120 may include an epitaxial layer of a semiconductor material (also referred to herein as the "first semiconductor material"). The first semiconductor material may be, for example, a group III-V material (e.g., gallium nitride). In one implementation, the epitaxial layer of the first semiconductor material is not doped with impurities.

The second semiconductor layer 140 can include one or more epitaxial layers of semiconductor materials and/or any other suitable material. For example, the second semiconductor layer 140 can include one or more layers formed from one or more group III-V materials (e.g., group III-nitride materials, such as gallium nitride). In some embodiments, one or more portions of semiconductor layer 140 may be doped to have a desired conductivity (e.g., an n-type conductivity, a p-type conductivity). For example, multiple crystalline layers of the semiconductor layer 140 can be doped to have different conductivities (e.g., opposing conductivities). Integrated circuit devices (e.g., transistors, diodes, thyristors, LEDs, and laser diodes) can be fabricated in the second semiconductor layer 140. Doping may be performed during the epitaxial growth of one or more portions of the second semiconductor layer 140 in one implementation. In another implementation, doping can be performed after the epitaxial growth (e.g., using ion implantation into one or more of the epitaxial layers in semiconductor layer 140).

In some embodiments, as illustrated in FIG. 1A, the second semiconductor layer 140 can include a first crystalline layer 142, an active layer 144, a second crystalline layer 146, and/or any other suitable component. The first crystalline layer 142 may include one or more layers. For example, the first crystalline layer 142 can include a doped layer of a group III-V material that is doped with a particular impurity, etc. The first crystalline layer 142 may be formed by a suitable epitaxial growth process, such as an MOCVD process, an HVPE process, an MBE process, etc. The first crystalline layer 142 may or may not include an undoped layer. In some embodiments, the first crystalline layer 142 may be formed from III-nitride based compound semiconductor doped with a first conductive type impurity. The first conductivity impurity may be an n-type impurity in some embodiments.

The active layer 144 may be formed on the first crystalline layer 142. The active layer 144 can include a single quantum well structure or a multi-quantum well (MQW) structure in which well layers (not shown in FIG. 1A) and barrier layers (not shown in FIG. 1A) are alternately stacked on one another. The active layer 144 can include InGaN, GaN, and/or any other suitable material to form the single quantum well and/or the MQW.

The second crystalline layer 146 may be deposited on the active layer 144. The second crystalline layer 146 can be formed from a group III-nitride based compound semiconductor, such as an (Al, Ga, In)N-based nitride semiconductor. In some embodiments, the second crystalline layer 146 may be a GaN layer. The second crystalline layer 146 can be doped with a second conductive type impurity that is different from the first conductive type impurity. For example, the second conductive type impurity may be a p-type impurity. In some embodiments, the second crystalline layer 144 may be doped by adding suitable dopants (e.g., silicon, magnesium, etc.) and/or dopant gases (e.g., silane, disilane, etc.) during the deposition process of the second crystalline layer 144.

When energized, the second semiconductor layer 140 may produce light. For example, when an electrical current passes through the active layer 144, electrons from the crystalline layer 142 (e.g., an n-doped layer) may combine in the active layer 144 with holes from the crystalline layer 146 (e.g., a p-doped layer). The combination of the electrons and the holes may generate light.

The semiconductor device 100 may further include a light-reflection layer 130 positioned between the first semiconductor layer 120 and the second semiconductor layer 140. The light-reflection layer 130 may be configured to cause one or more portions of light produced by the second semiconductor layer 140 (e.g., light produced by the active layer 144 of the semiconductor layer 140) to emerge from the semiconductor device 100 via a surface of the second semiconductor layer 140. The surface may be and/or include a surface of the semiconductor device 100 (e.g., surface 148 as illustrated in FIG. 1A). For example, one or more portions of the light produced by the second semiconductor layer 140 (e.g., the light produced by the active layer 144) may impinge on a surface of the light-reflection layer 130 and may be reflected by the light-reflection layer 130. As illustrated in FIG. 1A, a light ray 160a produced by the active layer 144 may impinge on the light-reflection layer 130 and may be reflected from a surface of the light-reflection layer 130. One or more portions of the reflected ray 160*b* may emerge from the semiconductor device 100 via the surface 148.

The light-reflection layer 130 may include any suitable reflective material. The reflective material can be any suitable material that can reflect at least a portion of light incident on the light-reflection layer 130 (e.g., light produced by the second semiconductor layer 140). The reflective material and the first semiconductor material may have different refractive indices. For example, the reflective material can be a metal (e.g., an element, compound, alloy, etc.). In some implementations, the light-reflection layer 130 may include a group III material, such as gallium. The first semiconductor layer 120 may include a semiconductor material including the group III material, such as gallium nitride.

In some embodiments, the first semiconductor layer 120 may be separated from the substrate 110 to form a light-emitting device 180 as illustrate in FIG. 1B. The separation may be made using any suitable technique. For example, the first semiconductor layer 120 may be separated from the substrate 100 using a wire saw. As another example, the first semiconductor layer 120 may be separated from the substrate 110 by laser lift-off and/or chemical lift-off.

In some embodiments, a semiconductor layer (not shown) including air voids may be formed between the substrate 110 and the first semiconductor layer 120 (also referred to as the "sacrificial layer"). In some embodiments, the sacrificial layer may be regarded as being part of the substrate 110. The first semiconductor layer 120 may be separated from the substrate 110 via the sacrificial layer. For example, the first semiconductor layer 120 can be separated from the substrate 110 by application of physical force to the sacrificial layer. As another example, the first semiconductor layer 120 can be separated from the sacrificial layer by chemical etching. In some embodiments, after separation of the first semiconductor layer 120 from the substrate 110, the sacrificial layer can remain on the substrate 110.

While certain layers of semiconductor materials and/or reflective materials are shown in FIGS. 1A-1B, this is merely illustrative. For example, one or more intervening layers may or may not be deposited between the first semiconductor layer 120 and the light-reflection layer 130. One or more intervening layers may or may not be deposited between the light-reflection layer 130 and the second semiconductor 140. In one implementation, a first surface of the first semiconductor layer 120 may directly contact with a surface of the substrate 100. The second semiconductor layer 120 may be deposited directly on a second surface of the first semiconductor layer 120. In another implementation, one or more intervening layers (not shown in FIGS. 1A-1B) may be formed between the first semiconductor layer 120 and the light-reflection layer 130. Alternatively or additionally, one or more intervening layers (not shown in FIG. 1A) may be deposited between the first semiconductor layer 120 and the substrate 110. In some embodiments, devices 100 and/or 180 can include one or more layers of semiconductor materials and/or any other material that are formed on the second semiconductor layer 140.

Figure 2:
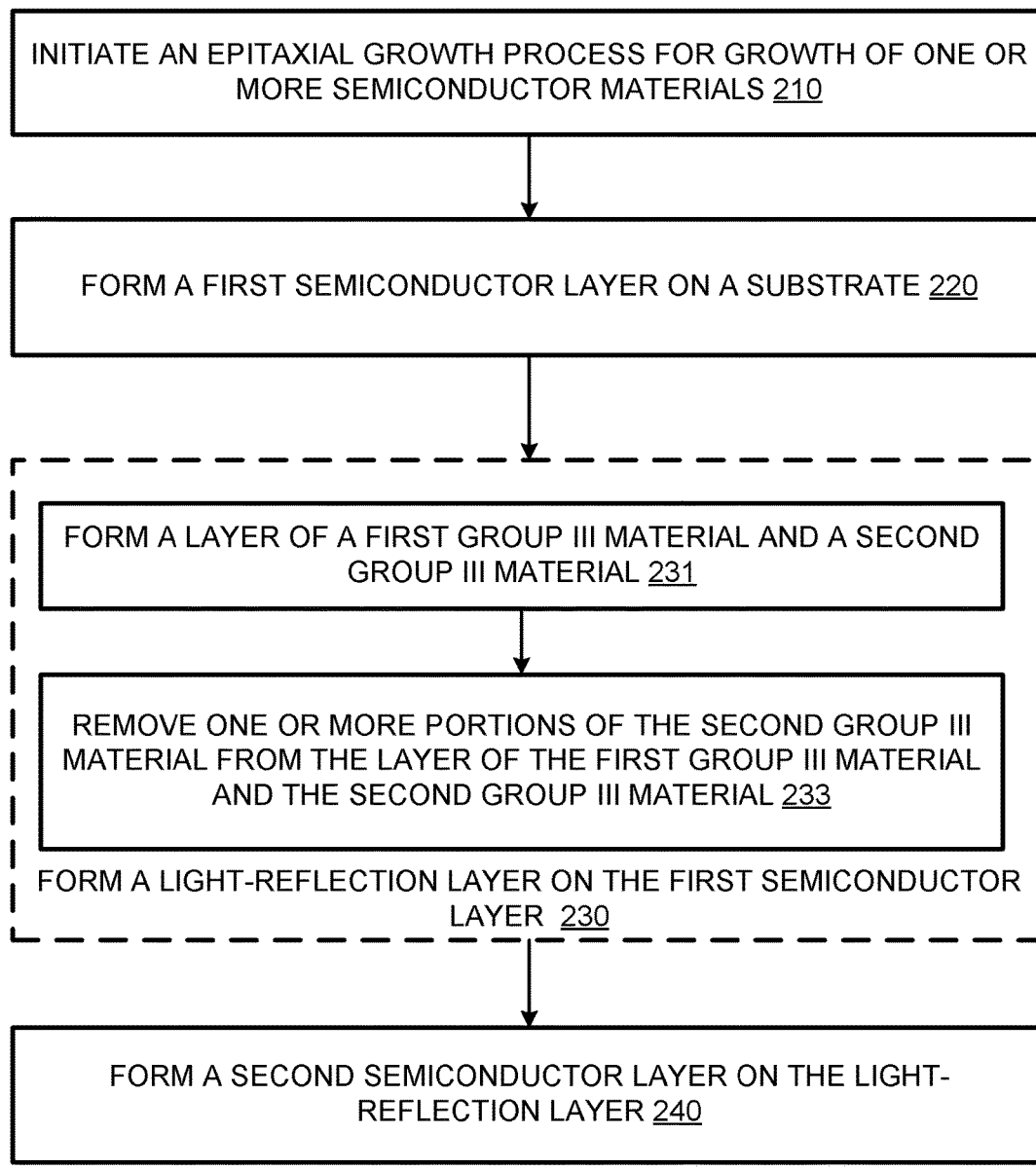
FIG. 2 is a flow diagram illustrating a method for fabricating a semiconductor device according to some embodiments of the disclosure.

FIG. 2 is a flow diagram illustrating an example 200 of a method of producing a semiconductor device according to some embodiments of the disclosure. The semiconductor device may be and/or include a light-emitting device as described in connection with FIGS. 1A-1B above.

Method 200 may begin at block 210 where an epitaxial growth process may be initiated for growth of one or more semiconductor materials to produce the semiconductor device. Examples of the epitaxial growth process may include metal organic chemical vapor deposition (MOCVD) (also referred to as metalorganic vapor phase epitaxy (MOVPE)), molecular-beam epitaxy (MBE), vapor phase epitaxy (VPE), etc. As an example, an MOCVD process may be initiated to form an epitaxial layer of a group III nitride material (e.g., gallium nitride) by cleaning a substrate (e.g., the substrate 110 of FIG. 1A) in a processing chamber (e.g., a MOCVD reactor). The cleaning process may include heating the substrate to a desired temperature in a hydrogen ambient or any other suitable ambient. The desired temperature may be any temperature within a range of desired temperatures (e.g., a temperature between approximately 1100° C. and approximately 1200° C.).

At block 220, a first semiconductor layer may be formed on a substrate. For example, an epitaxial layer of a semiconductor material (also referred to as the "first epitaxial layer") can be formed. The first epitaxial layer may be formed at a desired growth temperature. More particularly, for example, the temperature in the processing chamber may be adjusted to a first value that is suitable for the growth of the group III-V material. For example, the first value may be greater than 900° C. In some embodiments, the first value may be between approximately 900° C. and approximately 1100° C.

Suitable precursors may be provided to the processing chamber to grow the semiconductor material. The precursors may contain a group III material, a group V material, etc. For example, precursors containing gallium and nitride may be provided to grow gallium nitride. For example, a GaN layer may be deposited using gallium and nitrogen containing precursors. Examples of gallium containing precursors may include trimethylgallium (TMGa), triethylgallium (TEGa), and/or any other suitable source of gallium. Examples of nitrogen containing precursors may include ammonia, phenylhydrazine, and/or any other suitable source of nitrogen. The gallium and nitrogen containing precursors may be supplied for a suitable period of time to achieve deposition of a crystalline layer of a desired thickness. In some embodiments, the first semiconductor layer may include an undoped layer of the first semiconductor material that is not doped with impurities.

At block 230, a light-reflection layer may be formed on the first semiconductor layer. The light-reflection layer may or may not directly contact with the first semiconductor layer. The light-reflection layer may be formed from any suitable reflective material. In some embodiments, the first semiconductor material has a first refractive index. The reflective material has a second refractive index. The first refractive index may be different from the second refractive index. The reflective material may include, for example, a metal. In one implementation, the reflective material comprises a group III material, such as gallium. In some embodiments, the light-reflection layer may be formed by performing one or more operations depicted in blocks 231-233.

At block 231, a layer of a first group III material and a second group III material (also referred to as the "intermediate layer") can be formed. The first group III material may be, for example, gallium. The second group III material may be, for example, indium. In some embodiments, the intermediate layer may be and/or include an InGaN layer. The intermediate layer may be formed at a desired growth temperature. For example, the temperature in the processing chamber may be adjusted to a first temperature to form the layer of the first group III material and the second group III material. The first temperature may be lower than the first value. In some embodiments, the first temperature may be a temperature within a range between 300° C. and 800° C. Precursors containing the first group III material and the second group III material can be provided to the processing chamber. The precursors may include, for example, a first precursor comprising the first group III material and a second precursor comprising the second group III material. In one implementation, the first precursor may be and/or include any suitable source of gallium, such as TEGa, TMGa, etc. The second precursor may be and/or include any suitable source of indium. In some embodiments, certain amounts of the first precursor and/or the second precursor may be provided to achieve a certain composition of the second group III material in the precursors. In some embodiments, the composition of the second group III material may be greater than a threshold and/or within a range of desired compositions of the second group III material. For example, the composition of the second group III material in the precursors may be greater than 5%. As another example, the composition of the second group III material in the precursors may be greater than 35%.

At block 233, one or more portions of the second group III material may be removed from the layer of the first group III material and the second group III material to form the light-reflection layer. For example, the flow of the second precursor may be stopped. A gas flow may be supplied to the processing chamber to form the light-reflection layer. The gas flow may include a hydrogen gas flow. In some embodiments, the gas flow may include a mixture of hydrogen, nitrogen, and/or ammonia. The presence of the gas flow may remove one or more portions of the second group III material (e.g., indium) from the intermediate layer. For example, droplets of the second group III material (e.g., indium droplets) may be removed by the gas flow. The presence of the gas flow may also retard incorporation of the second group III material into the intermediate layer and/or the light-reflection layer. For example, the presence of hydrogen gas in the processing chamber may result in no or low incorporation of indium into indium gallium nitride. In some embodiments, the temperature in the processing chamber may be adjusted to a second temperature when the gas flow is provided to the processing chamber. The second temperature may be higher than the first temperature. The second temperature may be higher than 800° C. in some embodiments.

At block 240, a second semiconductor layer may be formed on the light-reflection layer. The second semiconductor layer may or may not directly contact with the light-reflection layer. The second semiconductor layer may include one or more epitaxial layers of one or more semiconductor materials (e.g., the first semiconductor material, a second semiconductor material, etc.).

In some embodiments, after the formation of the light-reflection layer, the temperature in the processing chamber may be controlled to a desired value (e.g., a temperature above 900° C., such as 1150° C.) to facilitate growth of the second semiconductor layer. Forming the second semiconductor layer may include, for example, forming a second epitaxial layer of the semiconductor material (e.g., the crystalline layer 142 of FIGS. 1A-1B). The second semiconductor layer may be doped with a first conductivity (e.g., n-type). Forming the second semiconductor layer may also include forming an active layer including one or more single quantum well structures and/or multi-quantum well structures (e.g., the active layer 144 of FIGS. 1A-1B). Forming the second semiconductor layer may further include forming a third epitaxial layer of the semiconductor material (e.g., the crystalline layer 146 of FIGS. 1A-1B). The third semiconductor layer may be doped with a second conductivity (e.g., p-type).

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or memory page media.

The terms "approximately" and "about" may be used to mean within ±20% of a target dimension in some embodiments, within ±10% of a target dimension in some embodiments, within ±5% of a target dimension in some embodiments, and yet within ±2% in some embodiments. The terms "approximately" and "about" may include the target dimension.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A method for producing a semiconductor device, comprising:
    forming, on a first semiconductor layer comprising a first epitaxial layer of a group III-V material, a light-reflection layer for reflecting at least a portion of light produced by a second semiconductor layer of the semiconductor device, wherein the group III-V material comprises a first group III material, and wherein forming the light-reflection layer further comprises:
        forming an intermediate layer comprising the first group III material and a second group III material; and
        removing at least a portion of the second group III material from the intermediate layer; and
    forming the second semiconductor layer on the light-reflection layer.

2. The method of claim 1, wherein the first semiconductor layer comprises a semiconductor material having a first refractive index, wherein the light-reflection layer comprises a reflective material having a second refractive index, and wherein the first refractive index is different from the second refractive index.

3. The method of claim 1, further comprising forming the first semiconductor layer using at least one of a metal organic chemical vapor deposition (MOCVD) process or a molecular beam epitaxy (MBE) process.

4. The method of claim 1, wherein the first group III material comprises gallium, and wherein the second group III material comprises indium.

5. The method of claim 4, wherein forming the intermediate layer comprises adjusting a temperature in a processing chamber to a first temperature, and wherein removing at least the portion of the second group III material comprises adjusting the temperature in the processing chamber to a second temperature.

6. The method of claim 5, wherein the second temperature is higher than the first temperature.

7. The method of claim 6, wherein the first temperature is between 300° C. and 800° C.

8. The method of claim 6, wherein the second temperature is higher than 800° C.

9. The method of claim 5, wherein forming the intermediate layer further comprises:
    flowing a first precursor comprising the first group III material in the processing chamber; and
    flowing a second precursor comprising the second group III material in the processing chamber.

10. The method of claim 9, wherein removing at least the portion of the second group III material from the intermediate layer further comprises:
    flowing a gas flow comprising hydrogen in the processing chamber.

11. The method of claim 10, wherein removing at least the portion of the second group III material from the first semiconductor layer further comprises:
    stopping flowing the second precursor in the processing chamber.

* * * * *